(12) United States Patent
Okada et al.

(10) Patent No.: US 7,964,516 B2
(45) Date of Patent: Jun. 21, 2011

(54) FILM FORMATION APPARATUS FOR SEMICONDUCTOR PROCESS AND METHOD FOR USING SAME

(75) Inventors: Mitsuhiro Okada, Nirasaki (JP); Yamato Tonegawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 162 days.

(21) Appl. No.: 12/401,214

(22) Filed: Mar. 10, 2009

(65) Prior Publication Data

US 2009/0233454 A1    Sep. 17, 2009

(30) Foreign Application Priority Data

Mar. 14, 2008  (JP) ................................. 2008-066326
Feb. 9, 2009  (JP) ................................. 2009-027098

(51) Int. Cl.
*H01L 21/31* (2006.01)
*C23C 16/00* (2006.01)

(52) U.S. Cl. ........ 438/787; 438/791; 438/905; 118/719; 118/724

(58) Field of Classification Search ........................ None
See application file for complete search history.

(56) References Cited

U.S. PATENT DOCUMENTS 5,041,311 A * 8/1991 Tsukune et al. ............... 427/579
5,976,900 A * 11/1999 Qiao et al. ....................... 438/14
2003/0215963 A1* 11/2003 AmRhein et al. .................. 438/9
2005/0085098 A1* 4/2005 Timmermans et al. ........ 438/794
2006/0032444 A1* 2/2006 Hara ............................ 118/715
2006/0121194 A1* 6/2006 Aiso ........................... 427/248.1
2007/0292974 A1* 12/2007 Mizuno et al. ..................... 438/5
2009/0155606 A1* 6/2009 Yoon et al. ..................... 428/446
2009/0197425 A1* 8/2009 Ishimaru ...................... 438/761

FOREIGN PATENT DOCUMENTS

| JP | 9-171968 | 6/1997 |
| JP | 9-246256 | 9/1997 |
| JP | 2002-313740 | 10/2002 |
| JP | 2003-7700 | 1/2003 |
| JP | 2003-188159 | 7/2003 |

* cited by examiner

*Primary Examiner* — Scott B Geyer
(74) *Attorney, Agent, or Firm* — Smith, Gambrell & Russell, LLP

(57) ABSTRACT

A method for using a film formation apparatus includes, in order to inhibit metal contamination: performing a cleaning process using a cleaning gas on an inner wall of a process container and a surface of a holder with no productive target objects held thereon; and then, performing a coating process of forming a silicon nitride film by alternately supplying a silicon source gas and a nitriding gas to cover with the silicon nitride film the inner wall of the process container and the surface of the holder with no productive target objects held thereon.

16 Claims, 9 Drawing Sheets

FILM FORMATION APPARATUS FOR SEMICONDUCTOR PROCESS AND METHOD FOR USING SAME

BACKGROUND OF THE INVENTION

1. Field of the Invention

The present invention relates to a film formation apparatus for a semiconductor process for forming a thin film made of, e.g., $SiO_2$ on a target object, such as a semiconductor wafer, and a method for using the same, and particularly to a technique for inhibiting metal contamination inside the film formation apparatus. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In the process of manufacturing semiconductor devices, there is used a film formation step for forming a thin film made of, e.g., $SiO_2$ on a semiconductor wafer, such as a silicon wafer. In the film formation step, a vertical heat processing apparatus of the batch type may be used to perform film formation by chemical vapor deposition (CVD) on a plurality of semiconductor wafers together at a time.

Owing to the demands for increased miniaturization and integration of semiconductor devices, thin films made of, e.g., $SiO_2$ are required to have higher quality. For example, Jpn. Pat. Appln. KOKAI Publication No. 2003-7700 discloses a technique for realizing a thin film of high quality. According to this technique, an ALD (atomic layer deposition) or MLD (molecular layer deposition) method is used to form an $SiO_2$ film by alternately supplying a source gas of a thin film, such as an Si source gas, and an oxidizing agent to repeat lamination of films of an atomic layer level or molecular layer level.

Further, in manufacturing lines, a cleaning process using a cleaning gas is periodically performed to remove extraneous thin film components deposited inside a process container, so as to stably form a thin film of high quality.

On the other hand, Pat. Appln. KOKAI Publications No. 9-246256, No. 2002-313740, No. 2003-188159, and No. 9-171968 disclose techniques for forming a pre-coating inside a process container.

In recent years, thin films made of, e.g., $SiO_2$ have being increasingly required to address higher quality. One of the key factors that affect the characteristics of thin films is metal contamination to thin films. A contaminant source of metal contamination is a metal slipped into a process container.

Although a cleaning process is periodically performed inside the process container, a trace quantity of metal components may be mixed in a cleaning gas to be used for this cleaning process.

If metal components are mixed in the cleaning gas, a trace quantity of metal components is left in the process container after the cleaning process. Where residual metal components are very small in quantity and metal components scattered inside the process container fall within an allowable quantity range, they are harmless. However, the quantity of scattered metal components has been required to fall within a narrower allowable range year by year.

In the future, as regards a process container periodically cleaned by the conventional technique, if the allowable range becomes very narrow, it may be unacceptable to return the process container to the original line or it may be necessary to give up reuse of the process container.

BRIEF SUMMARY OF THE INVENTION

An object of the present invention is to provide a film formation apparatus for a semiconductor process and a method for using the same, which can prevent a metal component from being scattered inside a process container and can address a narrower allowable range of scattered metal quantity. Another object of the present invention is to provide a computer readable medium that stores program instructions for executing the method.

According to a first aspect of the present invention, there is provided a method for using a film formation apparatus for a semiconductor process, the apparatus comprising a vertical process container configured to set a vacuum state therein, a holder configured to hold a plurality of productive target objects stacked at intervals inside the process container, and a heating device disposed around the process container, the method comprising, in order to inhibit metal contamination: performing a cleaning process using a cleaning gas on an inner wall of the process container and a surface of the holder with no productive target objects held thereon; and then, performing a coating process of forming a silicon nitride film by alternately supplying a silicon source gas and a nitriding gas to cover with the silicon nitride film the inner wall of the process container and the surface of the holder with no productive target objects held thereon.

According to a second aspect of the present invention, there is provided a film formation apparatus for a semiconductor process, the apparatus comprising: a vertical process container configured to set a vacuum state therein; a holder configured to hold a plurality of productive target objects stacked at intervals inside the process container; a heating device disposed around the process container; and a control section configured to control an operation of the apparatus, wherein the control section is preset to inhibit metal contamination by performing a cleaning process using a cleaning gas on an inner wall of the process container and a surface of the holder with no productive target objects held thereon; and then, performing a coating process of forming a silicon nitride film by alternately supplying a silicon source gas and a nitriding gas to cover with the silicon nitride film the inner wall of the process container and the surface of the holder with no productive target objects held thereon.

According to a third aspect of the present invention, there is provided a computer readable medium containing program instructions for execution on a processor, which is used for a film formation apparatus for a semiconductor process, the apparatus comprising a vertical process container configured to set a vacuum state therein, a holder configured to hold a plurality of productive target objects stacked at intervals inside the process container, and a heating device disposed around the process container, wherein the program instructions, when executed by the processor, cause the film formation apparatus to inhibit metal contamination by: performing a cleaning process using a cleaning gas on an inner wall of the process container and a surface of the holder with no productive target objects held thereon; and then, performing a coating process of forming a silicon nitride film by alternately supplying a silicon source gas and a nitriding gas to cover with the silicon nitride film the inner wall of the process container and the surface of the holder with no productive target objects held thereon.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
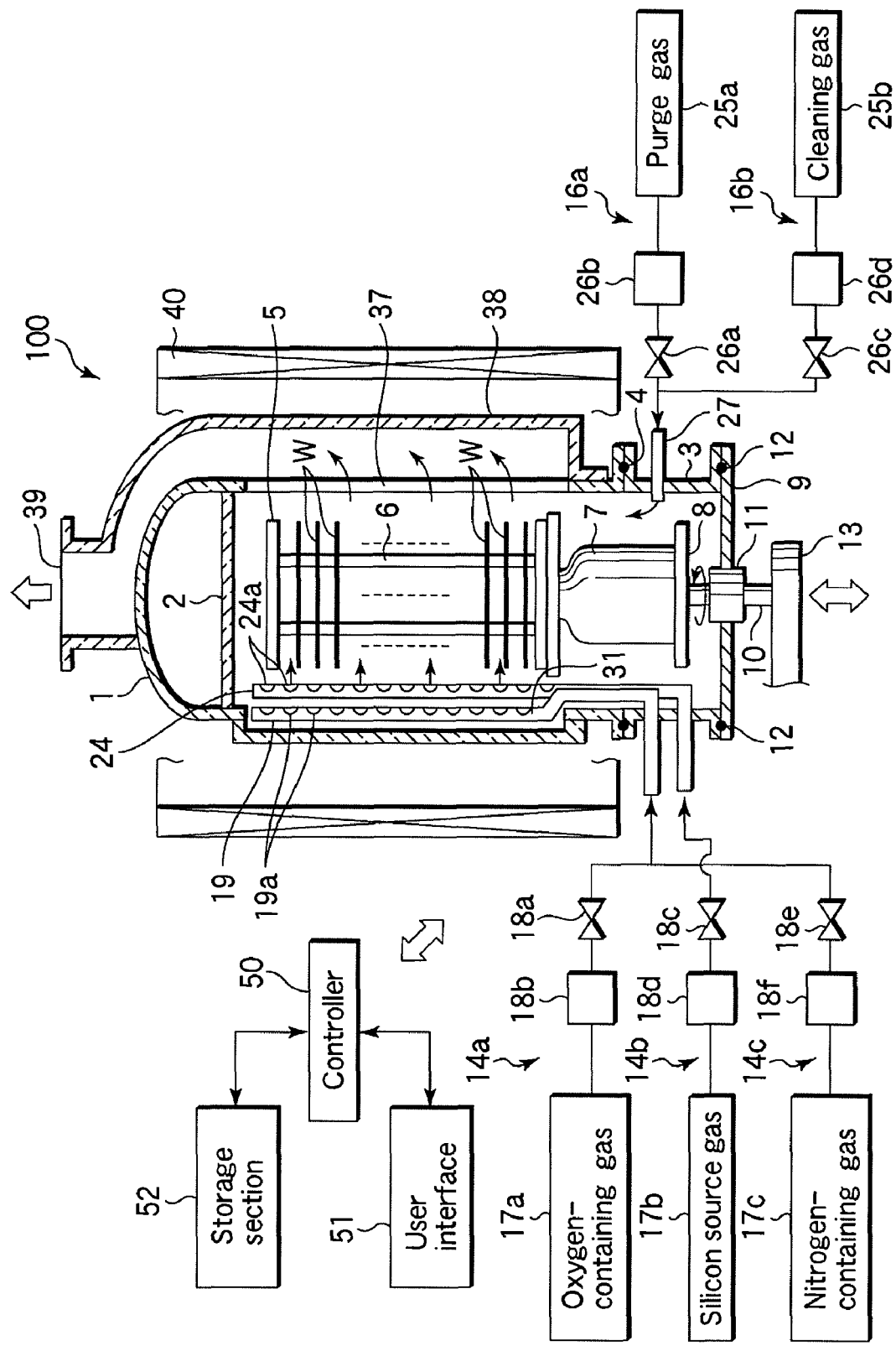
FIG. 1 is a sectional front view showing a film formation apparatus for a semiconductor process according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
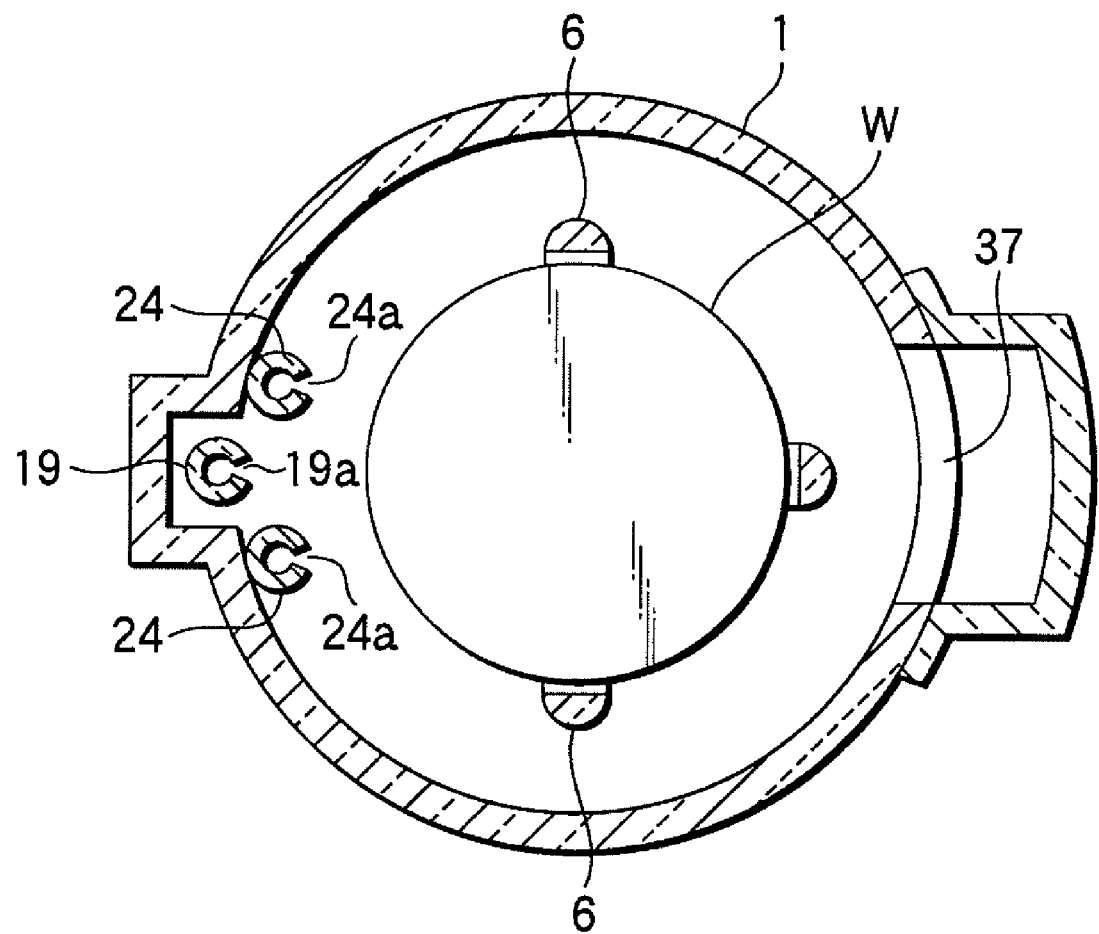
FIG. 2 is a sectional plan view of the film formation apparatus shown in FIG. 1.
Figure 3:
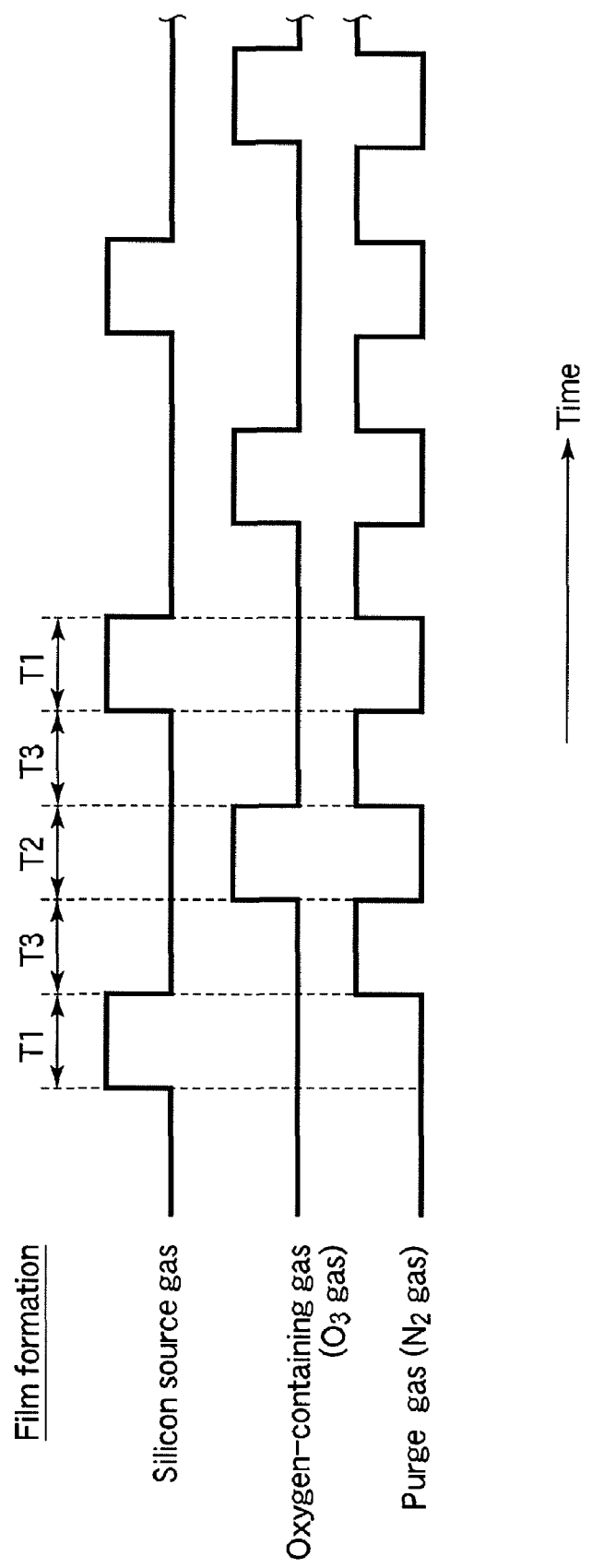
FIG. 3 is a timing chart showing gas supply timing used for a film formation process.

FIG. 1 is a sectional front view showing a film formation apparatus for a semiconductor process according to an embodiment of the present invention. FIG. 2 is a sectional plan view of the film formation apparatus shown in FIG. 1. FIG. 3 is a timing chart showing gas supply timing used in the film formation apparatus shown in FIG. 1. In FIG. 2, a heating device is not shown.

The film formation apparatus 100 includes a process container 1 shaped as a cylindrical column with a ceiling and an opened bottom. The entirety of the process container 1 is made of, e.g., quartz. The top of the process container 1 is provided with a quartz ceiling plate 2 to airtightly seal the top. The opened bottom of the process container 1 is connected through a seal member 4, such as an O-ring, to a cylindrical manifold 3 made of, e.g., stainless steel.

The manifold 3 supports the bottom of the process container 1. A wafer boat 5 made of quartz is moved up and down through the bottom port of the manifold 3, so that the wafer boat 5 is loaded/unloaded into and from the process container 1. A number of, such as about 50 to 100, target objects or semiconductor wafers W are stacked on a wafer boat 5. The wafer boat 5 has three struts 6 (see FIG. 2) with grooves on which a number of wafers W are respectively supported.

The wafer boat 5 is placed on a table 8 through a heat-insulating cylinder 7 made of quartz. The table 8 is supported by a rotary shaft 10, which penetrates a lid 9 made of, e.g., stainless steel, and used for opening/closing the bottom port of the manifold 3.

The portion of the lid 9 where the rotary shaft 10 penetrates is provided with, e.g., a magnetic-fluid seal 11, so that the rotary shaft 10 is rotatably supported in an airtightly sealed state. A seal member 12, such as an O-ring, is interposed between the periphery of the lid 9 and the bottom of the manifold 3, so that the interior of the process container 1 can be kept sealed.

For example, the rotary shaft 10 is attached at the distal end of an arm 13 supported by an elevating mechanism (not shown), such as a boat elevator. The elevating mechanism moves the wafer boat 5 and lid 9 up and down in unison into and from the process container 1. The table 8 may be fixed to the lid 9, so that wafers W are processed without rotation of the wafer boat 5.

The film formation apparatus 100 includes an oxygen-containing gas supply mechanism 14a, a silicon source gas supply mechanism 14b, and a nitrogen-containing gas supply mechanism 14c, which are prepared for supplying film formation gases for a film formation process. The oxygen-containing gas supply mechanism 14a is arranged to supply an oxygen-containing gas, such as ozone ($O_3$) gas, into the process container 1. The silicon source gas supply mechanism 14b is arranged to supply a silicon source gas, such as dichlorosilane (DCS) gas, into the process container 1. The nitrogen-containing gas supply mechanism 14c is arranged to supply a nitrogen-containing gas, such as ammonia ($NH_3$) gas, into the process container 1.

Further, the film formation apparatus 100 includes purge gas supply mechanism 16a and a cleaning gas supply mechanism 16b. The purge gas supply mechanism 16a is arranged to supply an inactive gas, such as nitrogen ($N_2$) gas, used as a purge gas into the process container 1. The cleaning gas supply mechanism 16b is arranged to supply a halogen and/or hydrogen-containing gas, such as hexafluoroethane ($C_2F_6$) gas, as a cleaning gas into the process container 1.

The oxygen-containing gas supply mechanism 14a includes an oxygen-containing gas supply source 17a and a distribution nozzle 19 connected to each other through a gas line for supplying the oxygen-containing gas. The distribution nozzle 19 is formed of a quartz pipe that penetrates the sidewall of the manifold 3 from outside and then turns and extends vertically upward. The vertical portion of the distribution nozzle 19 has a plurality of gas spouting holes 19a formed thereon at predetermined intervals, so that the oxygen-containing gas, such as $O_3$ gas, is almost uniformly delivered in the horizontal direction from the gas spouting holes 19a toward the process container 1. The gas line for supplying the oxygen-containing gas is provided with a switching valve 18a and a flow rate controller 18b, such as a mass flow controller, so that the oxygen-containing gas can be supplied at a controlled flow rate into the distribution nozzle 19.

The silicon source gas supply mechanism 14b includes a silicon-containing gas supply source 17b and a pair of distribution nozzles 24 connected to each other through a gas line for supplying the silicon-containing gas, i.e., silicon source gas. Each of the distribution nozzles 24 is formed of a quartz pipe that penetrates the sidewall of the manifold 3 from outside and then turns and extends vertically upward, as in the distribution nozzle 19. The vertical portion of each distribution nozzle 24 also has a plurality of gas spouting holes 24a formed thereon at predetermined intervals, so that the silicon source gas, such as DCS gas, is almost uniformly delivered in the horizontal direction from the gas spouting holes 24a toward the process container 1. The gas line for supplying the silicon source gas is provided with a switching valve 18c and a flow rate controller 18d, so that the silicon source gas can be supplied at a controlled flow rate into the distribution nozzles 24, as in the oxygen-containing gas.

The nitrogen-containing gas supply mechanism 14c includes a nitrogen-containing gas supply source 17c. In this embodiment, the gas supply source 17c is connected to the distribution nozzle 19 through a gas line for supplying the nitrogen-containing gas. The nitrogen-containing gas is almost uniformly delivered in the horizontal direction from the gas spouting holes 19a toward the process container 1. The gas line for supplying the nitrogen-containing gas is provided with a switching valve 18e and a flow rate controller 18f, so that the nitrogen-containing gas can be supplied at a controlled flow rate into the distribution nozzle 19, as in the oxygen-containing gas and silicon source gas. However, a distribution nozzle dedicated to the nitrogen-containing gas may be independently disposed to the process container 1.

The purge gas supply mechanism 16a includes a purge gas supply source 25a and a nozzle 27 connected to each other through a gas line for supplying the purge gas. The nozzle 27 is formed of a short quartz pipe that penetrates the sidewall of the manifold 3 from outside.

The cleaning gas supply mechanism 16b includes a cleaning gas supply source 25b. In this embodiment, the gas supply source 25b is connected to the nozzle 27 through a gas line for supplying the cleaning gas. However, a nozzle dedicated to the cleaning gas may be independently disposed to the process container 1.

The gas line for supplying the purge gas is provided with a switching valve 26a and a flow rate controller 26b, so that the purge gas can be supplied at a controlled flow rate into the distribution nozzle 27. The gas line for supplying the cleaning gas is provided with a switching valve 26c and a flow rate controller 26d, so that the cleaning gas can be supplied at a controlled flow rate into the distribution nozzle 27.

On the other hand, on the side of the process container 1 opposite to the distribution nozzles 19 and 24, the process container 1 has an exhaust port 37 formed thereon for vacuum-exhausting the interior of the process container 1. The exhaust port 37 has a long narrow shape formed by cutting the sidewall of the process container 1 in the vertical direction. The exhaust port 37 is covered with an exhaust port cover member 38 having a U-shape cross-section, and attached to the process container 1 by welding. The exhaust port cover member 38 extends upward along the sidewall of the process container 1, and has a gas outlet 39 at the top of the process container 1. The gas outlet 39 is connected to a vacuum-exhaust mechanism (not shown) including a vacuum pump and so forth, by which the interior of the process container 1 is vacuum-exhausted.

The process container 1 is surrounded by a cylindrical heating device 40 for heating the atmosphere and target object, such as semiconductor wafers W, inside the process container 1.

The film formation apparatus 100 includes a controller 50 comprising a microprocessor (computer), which controls the respective components in the film formation apparatus 100. For example, the controller 50 controls the switching valves 18a, 18c, 18e, 26a, and 26c to supply/stop the gases by opening/closing them, the flow rate controllers 18b, 18d, 18f, 26b, and 26d to adjust the flow rates of the gases, and the heating device 40. The controller 50 is connected to the user interface 51, which includes, e.g., a keyboard and a display, wherein the keyboard is used for an operator to input commands for operating the film formation apparatus 100, and the display is used for showing visualized images of the operational status of the film formation apparatus 100.

Further, the controller 50 is connected to a storage section 52 that stores recipes, i.e., control programs for the controller 50 to control the film formation apparatus 100 so as to perform various processes, and control programs for the respective components of the film formation apparatus 100 to perform processes in accordance with process conditions. For example, the recipes are stored in a storage medium included in the storage section 52. The storage medium may be formed of a medium of the stationary type, such as a hard disk or semiconductor memory, or a medium of the portable type, such as a CDROM, DVD, or flash memory. Alternatively, the recipes may be used online while they are transmitted from another apparatus through, e.g., a dedicated line, as needed. A required recipe is retrieved from the storage section 52 and executed by the controller 50 in accordance with an instruction or the like input through the user interface 51. Consequently, the film formation apparatus 100 can perform a predetermined process under the control of the controller 50.

For example, in the film formation apparatus 100, a film formation process is performed as follows.

FIG. 3 is a timing chart showing gas supply timing. In this example, the silicon source gas and oxygen-containing gas are alternately supplied into the process container 1 to form a silicon oxide film on semiconductor wafers W.

At first, the wafer boat 5 at room temperature, which supports a number of, such as 50 to 100, wafers, is loaded from below into the process container 1 heated at a predetermined temperature. For example, the semiconductor wafers W have a diameter of 300 mm. Then, the bottom port of the manifold 3 is closed by the lid 9 to set an airtight space inside the process container 1. Then, the interior of the process container 1 is vacuum-exhausted and kept at a predetermined process pressure. Further, the electric power applied to the heating device 40 is controlled to increase and set the wafer temperature to a process temperature. Then, while the wafer boat 5 is rotated, a film formation process is started As shown in FIG. 3, the film formation process is arranged to alternately repeat Step S1 of supplying a silicon source gas into the process container 1 to adsorb silicon on the semiconductor wafers W, and Step S2 of supplying an oxygen-containing gas, such as $O_3$ gas, into the process container 1 to oxidize the silicon. Step S3 is interposed between Steps 1 and 2 to remove residual gas from inside the process container 1. In Steps S1 to S3, the process temperature is set to be 100 to 400° C. In this way, the silicon source gas and oxygen-containing gas are alternately supplied into the process container 1, so that a silicon oxide film is formed on the semiconductor wafers W.

Incidentally, when a silicon oxide film is formed as described above, silicon oxide films are deposited on portions, other than the semiconductor wafers W, such as the inner wall of the process container 1 and the surface of components inside the process container 1, e.g., the wafer boat 5, table 8, and heat-insulating cylinder 7. In order to remove extraneous silicon oxide films (by-product films) formed on portions other than the semiconductor wafers W, a cleaning process using a cleaning gas is performed. For example, the cleaning gas is formed of $CF_4$, $C_2F_6$, or $NF_3$ where silicon oxide films (by-product films) are removed.

However, $CF_4$, $C_2F_6$, and $NF_3$ gases are corrosive, and thus may corrode the inner wall of piping lines. If the inner wall of piping lines is corroded, metal particles are generated from the corroded portions. The metal particles thus generated may be involved in the cleaning gas and slipped into the process container 1. When metal particles are slipped into the process container 1, they are deposited on the inner wall of the process container 1 and the surface of components inside the process container 1.

According to this embodiment made in light of this problem, the cleaning process is followed by a process for covering the inner wall of the process container 1 and the surface of components inside the process container 1 with a silicon nitride film, so that metal particles slipped into the process container 1 are sealed in the silicon nitride film.

Figure 4:
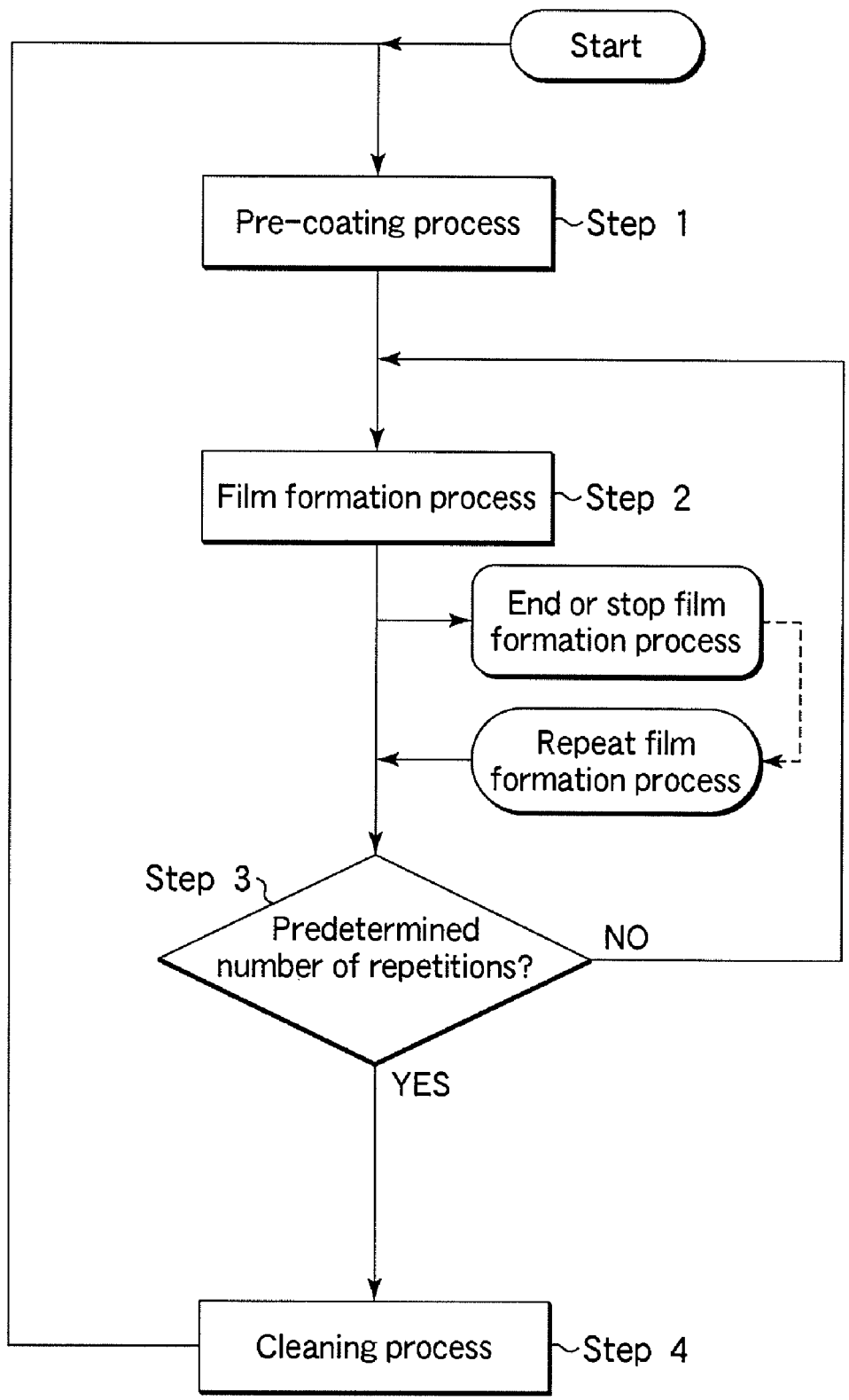
FIG. 4 is a flow chart showing the flow of a method for using a film formation apparatus, according to an embodiment of the present invention.

FIG. 4 is a flow chart showing the flow of a metal contamination inhibiting method according to an embodiment of the present invention.

As shown in FIG. 4, a pre-coating process is performed on the film formation apparatus when it is installed in a production line or re-installed in the line after a maintenance operation (just before it starts running), (Step 1). The pre-coating process is a step of covering the inner wall of the process container 1 and the surface of components (such as a wafer boat 5 with no productive wafers held thereon) inside the process container 1 with a silicon nitride film.

After the pre-coating process is finished, a film formation process is performed on target objects, such as productive semiconductor wafers supported by the wafer boat 5, in the film formation apparatus with the pre-coating film thus formed (Step 2). For example, where the film formation process is preset to form a silicon oxide film, the silicon source gas and oxygen-containing gas are alternately supplied, as shown in FIG. 3. Where the source gas and oxygen-containing gas are alternately supplied, an example of the silicon source gas, i.e., a precursor, is dichlorosilane (DCS: $SiH_2Cl_2$), while an example of the oxygen-containing gas, i.e., an oxidizing agent, is ozone ($O_3$).

Then, after the film formation process is finished, a judgment is made of whether the number of repetitions of the film formation process reaches a predetermined number (Step 3).

If the number of repetitions is less than the predetermined number (No), the flow returns to Step 2, and the film formation process is performed on the semiconductor wafers supported by the wafer boat 5.

On the other hand, if the number of repetitions reaches the predetermined number (Yes), the flow proceeds to Step 4, and the cleaning process using the cleaning gas is performed on the inner wall of the process container 1 and the surface of components (such as a wafer boat 5 with no productive wafers held thereon) inside the process container 1.

After the cleaning process is finished, the flow returns to Step 1, and the pre-coating process is performed to form a silicon nitride film.

Figure 5:
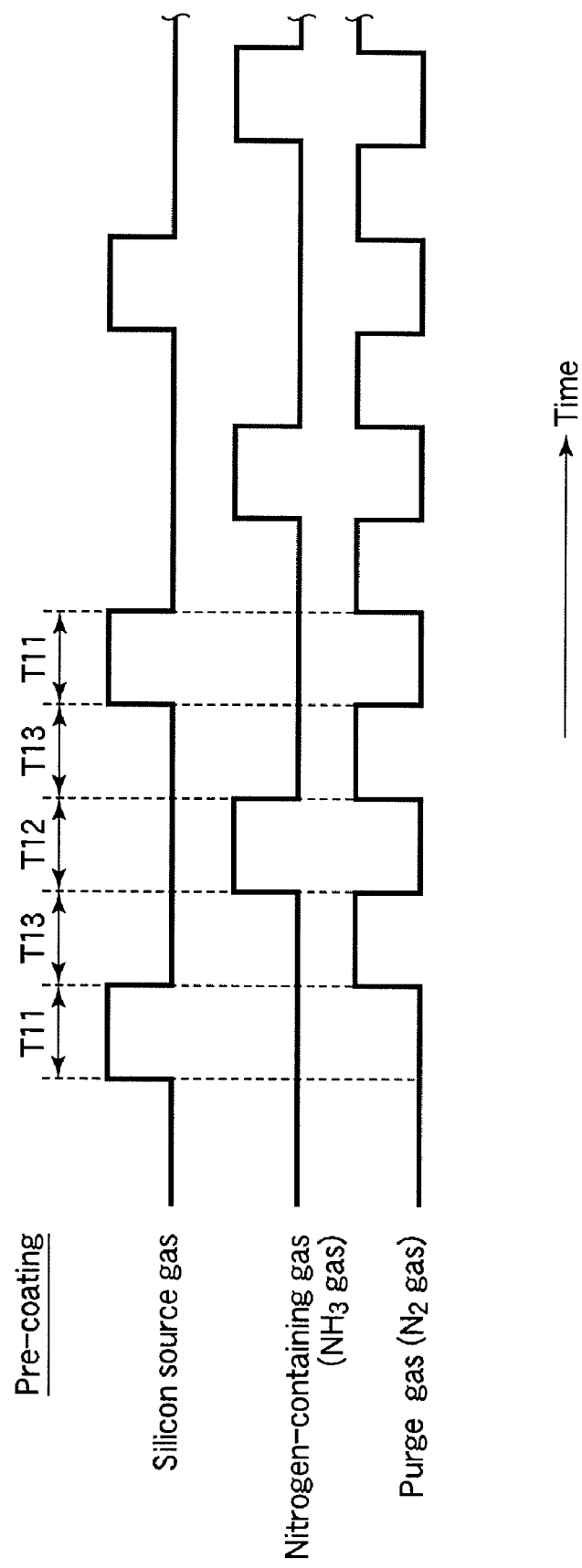
FIG. 5 is a timing chart showing gas supply timing used for a pre-coating process.

According to this embodiment, the pre-coating process, i.e., the film formation of a silicon nitride film, is performed by an MLD method as shown in FIG. 5, in place of an ordinary CVD method (in the following explanation, the term "CVD" means ordinary CVD arranged to continuously supply process gases, and thus excludes ALD and MLD).

As shown in FIG. 5, the film formation process of a silicon nitride film is arranged to alternately repeat Step S11 of supplying a silicon source gas into the process container 1 to adsorb silicon on the inner wall of the process container 1 and the surface of components inside the process container 1, and Step S12 of supplying an nitrogen-containing gas, such as $NH_3$ gas, into the process container 1 to nitride the silicon. Step S13 is interposed between Steps 11 and 12 to remove residual gas from inside the process container 1. At this time, for example, a purge gas, such as nitrogen ($N_2$), is used.

Where dichlorosilane (DCS) is used as a silicon source gas or precursor for the film formation process of a silicon nitride film, the process temperature is set to be 550° C. to 650° C. If the temperature is higher than this range, the film formation reaction becomes closer to CVD rather than MLD.

Further, hexachlorodisilane (HCDS: $Si_2Cl_6$) may be used as a precursor for this purpose. Where HCDS is used, the process temperature of this film formation is preferably set to be 450° C. to 550° C. This is so, because, if the temperature is higher than this range, the film formation reaction becomes closer to CVD rather than MLD, as in use of DCS.

MLD is used for this film formation reaction because of the following reason.

Figure 6:
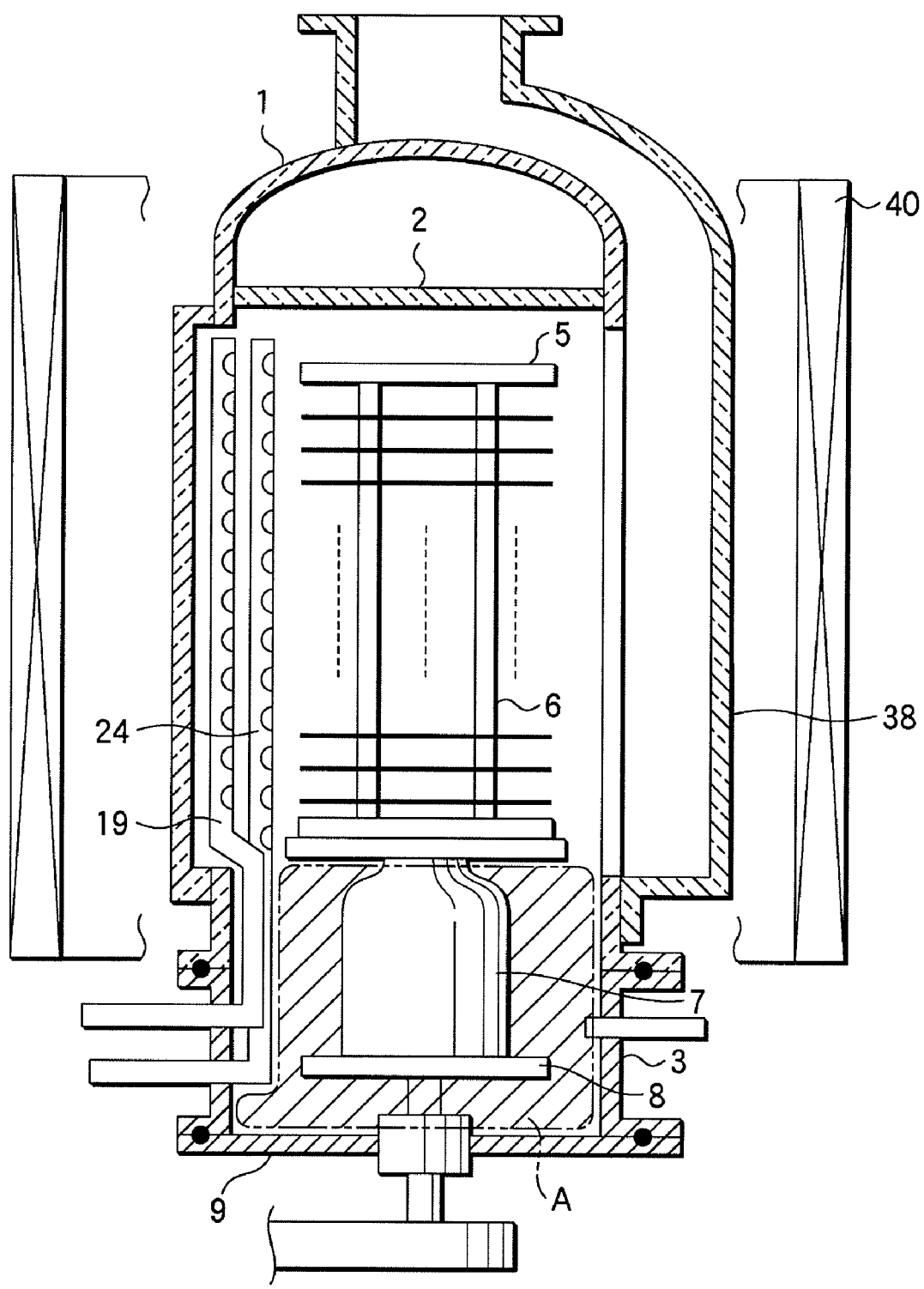
FIG. 6 is a sectional view showing the process container of the apparatus in an enlarged state.

FIG. 6 is a sectional view showing the process container 1 in an enlarged state.

As shown in FIG. 6, the film formation apparatus according to this embodiment is a vertical furnace, and thus has a vertical process container of the batch type for processing a plurality of target objects together at a time. Vertical process containers of the batch type have an inner space for accommodating a plurality of target objects, which is larger than that of process containers of the single-substrate type. Further, the wafer boat 5 with a plurality of target objects supported thereon is placed on the table 8 with the heat-insulating cylinder 7 interposed therebetween for heat insulation. Accordingly, the temperature difference becomes larger between the space that accommodates target objects and the space that accommodates the heat-insulating cylinder 7. For example, the temperature difference tends to be larger between the space inside the manifold 3 indicated by a reference symbol A and the space near the manifold 3. In the following explanation, the space indicated by the reference symbol A is called a lower temperature area and the space that accommodates the target objects is called a higher temperature area.

CVD may be usable only to cover the inner wall of the process container 1 and the surface of components inside the process container 1 with a silicon nitride film, after the cleaning process is finished. However, where CVD is used for this purpose, the higher temperature area can be covered with a silicon nitride film without a hitch, but the lower temperature area can be hardly covered with a silicon nitride film. As an experiment, CVD was used for depositing a silicon nitride film for this purpose under the following conditions.

Film formation method: CVD,
Film formation temperature: 800° C.,
Precursor: DCS,
Nitriding agent: $NH_3$, and
Flow rate ratio DCS/$NH_3$: 90/270 sccm.

When the conditions described above were used, the higher temperature area rendered a film formation amount (a film thickness on the quartz of the higher temperature area) tH of 3,000 angstroms (300 nm), and the lower temperature area rendered a film formation amount (a film thickness on the quartz of the lower temperature area) tL merely of 60 angstroms (6 nm). The ratio tH/tL of the film thickness tH relative to the film thickness tL was 50 (tH/tL=3,000/60=50).

Since the silicon nitride film has a film thickness of 60 angstroms, the effect of sealing in metals becomes insufficient at the lower temperature area. If the film formation is performed for the silicon nitride film to have a film thickness tH of larger than 3,000 angstroms at the higher temperature area, the silicon nitride film can have a film thickness tL of larger than 60 angstroms at the lower temperature area. In this case, the effect of sealing in metals is improved at the lower temperature area, but the film thickness tH of the silicon nitride film becomes too large at the higher temperature area and causes the silicon nitride film to be easily cracked and generate particles.

In light of the problem described above, this embodiment is arranged to use MLD in forming the silicon nitride film. As another experiment, MLD was used for depositing a silicon nitride film for this purpose under the following conditions.

Film formation method: MLD,
Film formation temperature: 600° C.,
Precursor: DCS,
Nitriding agent: $NH_3$,
Purge gas: $N_2$, and
Process cycle: repetition of DCS supply, $N_2$ purge, $NH_3$ supply, $N_2$ purge, and DCS supply.

When the conditions described above were used, the higher temperature area rendered a film formation amount (a film thickness on the quartz of the higher temperature area) tH of 900 angstroms (90 nm), and the lower temperature area A rendered a film formation amount (a film thickness on the quartz of the lower temperature area A) tL of 60 angstroms (6 nm). The ratio tH/tL of the film thickness tH relative to the film thickness tL was 15 (tH/tL=900/60=15). With this ratio being maintained, if the film formation is performed for the silicon nitride film to have a film thickness tH of 3,000 angstroms (300 nm) at the higher temperature area, the silicon nitride film can have a film thickness tL of 180 to 200 angstroms (18 to 20 nm) at the lower temperature area A. Where the film thickness tL is 180 to 200 angstroms, the effect of sealing in metals becomes sufficient at the lower temperature area A. Further, the film thickness tH of the silicon nitride film at the higher temperature area is maintained at a film thickness that allows the silicon nitride film to be hardly cracked and thus prevents particle generation.

Figure 7:
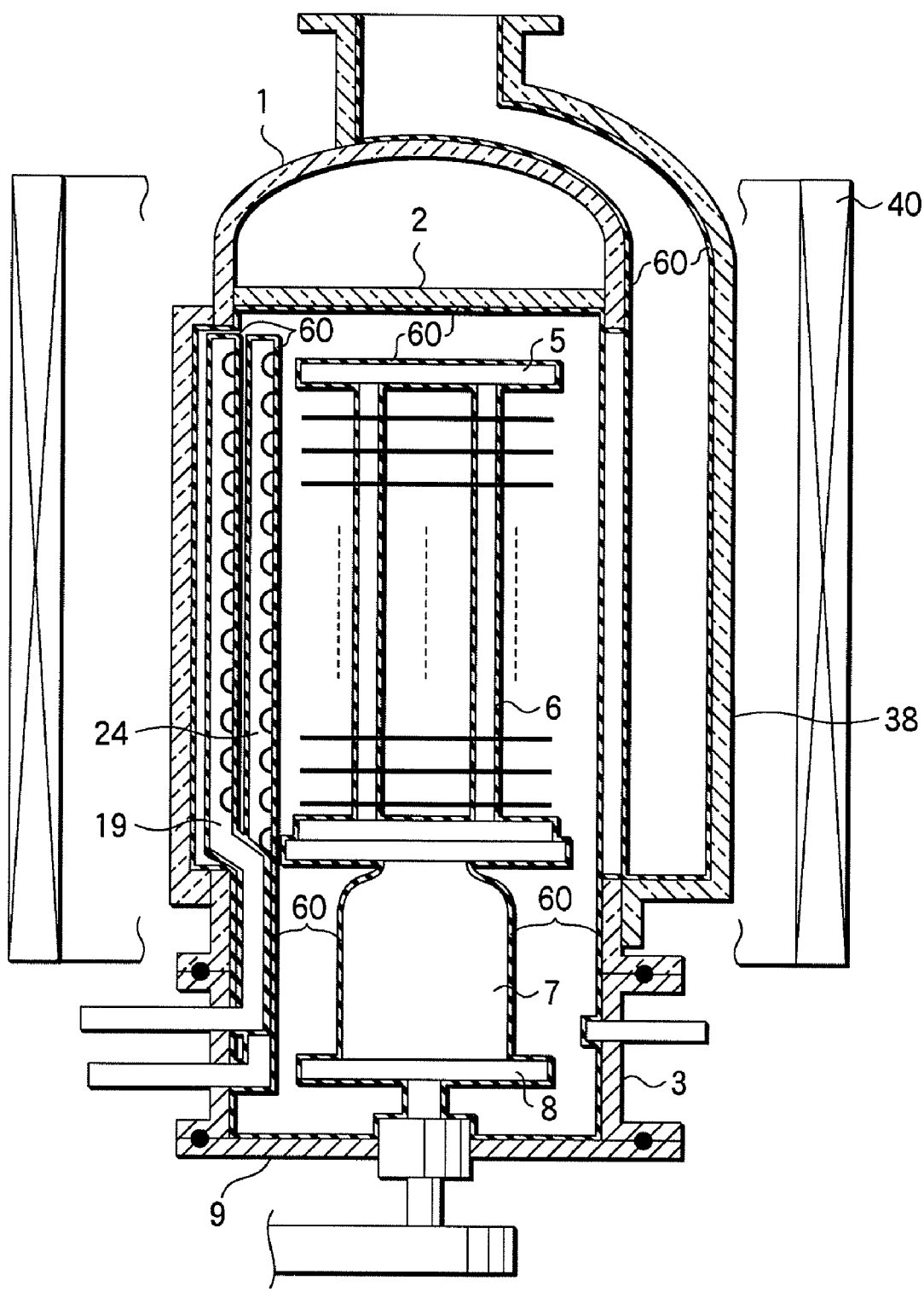
FIG. 7 is a sectional view showing the process container of the apparatus.

The ratio tH/tL of the film thickness tH relative to the film thickness tL may be set to be 1 to 15. For example, as the ratio tH/tL is closer to "1", the difference becomes smaller between the film thickness tH of the silicon nitride film at the higher temperature area and the film thickness tL of the silicon nitride film at the lower temperature area A. In this case, a silicon nitride film is uniformly formed inside the process container 1 and the surface of components inside the process container 1, even where the higher temperature area and lower temperature area A are present inside the process container of the film formation apparatus. FIG. 7 is a sectional view showing the process container 1 after the silicon nitride film is formed.

As shown in FIG. 7, according to this embodiment, the inner wall of the process container 1 and the surface of components inside the process container 1 are provided with a uniform silicon nitride film 60 formed thereon, such that the ratio tH/tL of the film thickness tH at the higher temperature area relative to the film thickness tL at the lower temperature area A is set to be 1 to 15.

As described above, this embodiment is arranged to use an MLD method in forming the silicon nitride film, so that, even where the higher temperature area and lower temperature area A are present inside the process container, a silicon nitride film 60 is uniformly formed over both of the higher temperature area and lower temperature area A. Consequently, there is provide a metal contamination inhibiting method that can cause the lower temperature area A not to lose the effect of sealing in metals, and can cause the higher temperature area to inhibit particle generation.

Figure 8:
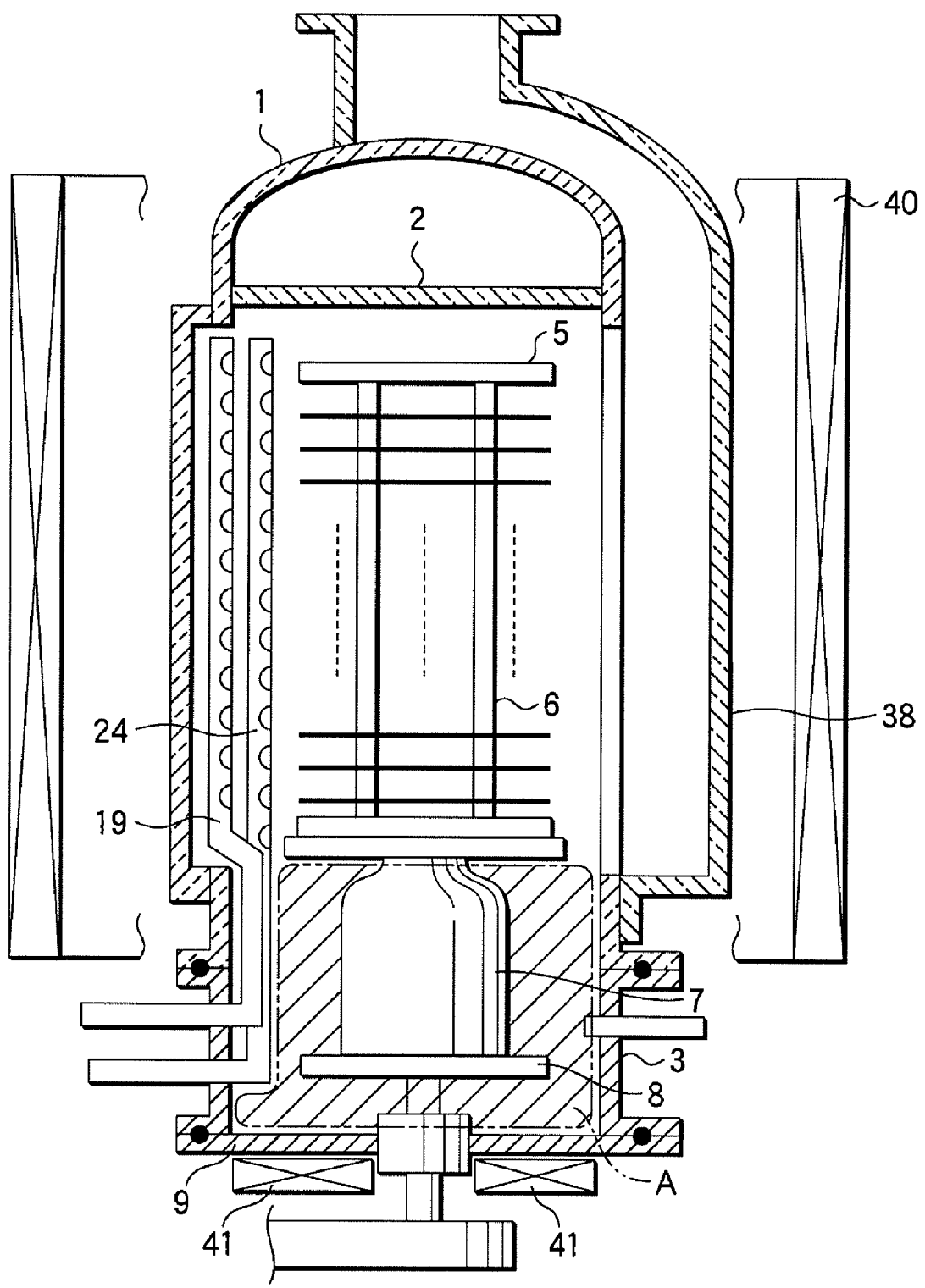
FIG. 8 is a sectional view showing a film formation apparatus according to a modification of the embodiment of the present invention.

As shown in FIG. 8, a heater 41 may be disposed outside the lid 9 and set at a temperature of, e.g., about 350° C. when the silicon nitride film 60 is formed by an MLD method. Specifically, in the pre-coating process of Step 1 in FIG. 4, the higher temperature area corresponding to the wafer boat 5 is heated by the heater 40 while the lower temperature area A is heated from below by the heater 41 set at a temperature lower than that of the heater 40. In the film formation process of Step 2 in FIG. 4, heating is performed by use solely of the heater 40 without using the heater 41.

For example, where the lower temperature area A is heated by the heater 41 while the silicon nitride film 60 is formed by an MLD method, gas adsorption in the lower temperature area A is promoted, and so the film formation amount in the lower temperature area A is increased. In this case, as a result of an increase in the film formation amount in the lower temperature area A, the film thickness tL of the silicon nitride film 60 at the lower temperature area A becomes much closer to the film thickness tH of the silicon nitride film 60 at the higher temperature area. As the film thickness tL becomes much closer to the film thickness tH, the ratio tH/tL between the film thickness tH and film thickness tL becomes much closer to "1".

As described above, where the lower temperature area A is additionally heated while the silicon nitride film 60 is formed by an MLD method, the silicon nitride film 60 is uniformly formed over both of the higher temperature area and lower temperature area A.

Figure 9A:
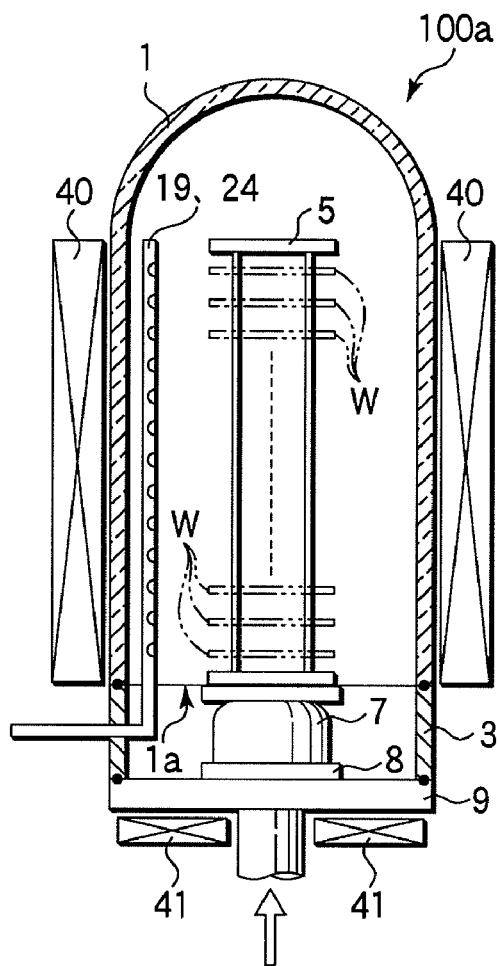
FIGS. 9A and 9B are sectional views respectively showing different states of the film formation apparatus shown in FIG. 8.
Figure 9B:
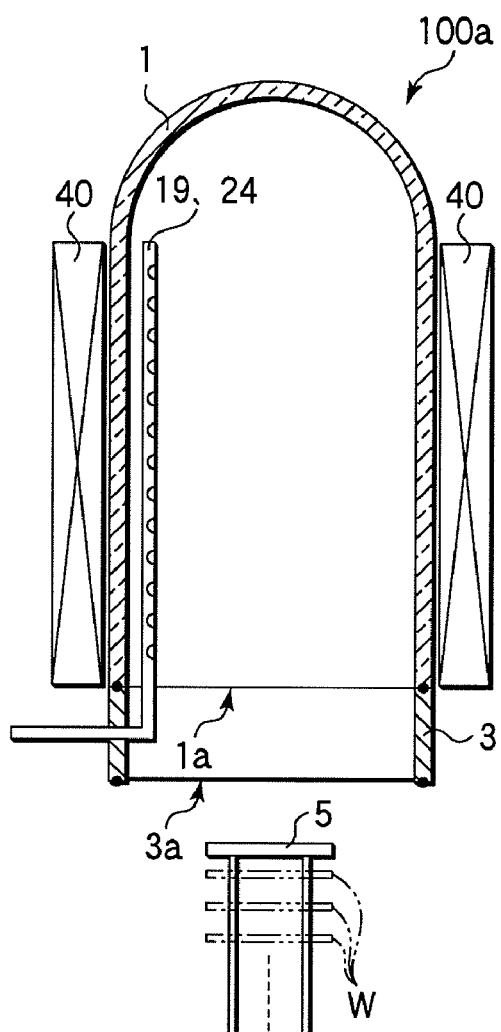
Figure 9B:
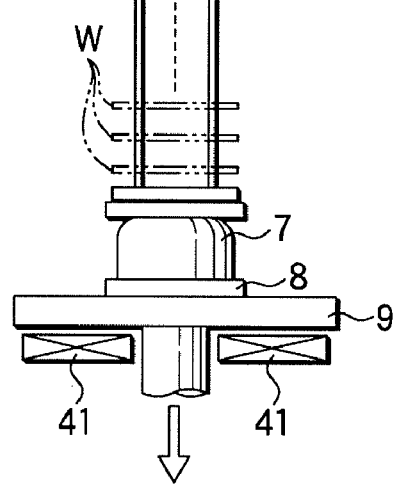

FIGS. 9A and 9B are sectional views respectively showing different states of the film formation apparatus shown in FIG. 8. FIG. 9A shows a state in which the wafer boat 5 is loaded inside the process container 1 with the lid 9 set at the upper position. FIG. 9B shows a state in which the wafer boat 5 is unloaded outside the process container 1 with the lid 9 set at the lower position. In FIGS. 9A and 9B, the exhaust port 37 and exhaust port cover member 38 are not illustrated.

As shown in 9A and 9B, the film formation apparatus 100a differs from the film formation apparatus 100 shown in FIG. 1 such that it is provided with the heater 41 outside the lid 9. The film formation apparatus 100a has a basic structure, as follows. Specifically, the film formation apparatus 100a includes a process container 1 shaped as a cylindrical column with a ceiling and an opening 1a at the bottom. The opening 1a of the process container 1 is connected to a cylindrical manifold 3 provided with gas lines 19 and 24 for supplying film formation gases into the process container 1. A lid 9 for opening/closing the opening 3a of the manifold 3 is disposed to be movable up and down. A wafer boat 5 serving as a holder is supported on the lid 9, so that a number of target objects or semiconductor wafers W are stacked on the wafer boat 5 in the process container 1. A first heating device, such as a heater 40, is disposed around the process container 1 to surround the wafer boat 5. A second heating device, such as a heater 41, is disposed outside the lid 9.

The heater 40 of the film formation apparatus 100a shown in FIGS. 9A and 9B is used for heating the semiconductor wafers W during a film formation process. Accordingly, the heater 40 is basically disposed around the process container 1 to surround the wafer boat 5. The heater 40 is essentially not required to heat the portions other than the portion corresponding to the wafer boat 5. Accordingly, portions separated from the heater 40, such as the heat-insulating cylinder 7, table 8, and lid 9, as well as the manifold 3 with gas lines 19 and 24 inserted therethrough for supplying film formation gases into the process container 1, are not directly heated by the heater 40, although they receive a waste heat. Accordingly, during the film formation process, the temperature of the manifold 3, heat-insulating cylinder 7, table 8, and lid 9 is lower than that of a portion around the wafer boat 5, such as the process container 1. This is one of the reasons that bring about the higher temperature area and lower temperature area A inside the process container 1.

In light of this problem, a heater 41 having, e.g., an annular or cylindrical shape is disposed outside the lid 9 to heat, e.g., the manifold 3, heat-insulating cylinder 7, table 8, lid 9, and portions around these members. When the silicon nitride film 60 is formed on the surface of components inside the process container 1, the heater 41 is used to heat, e.g., the manifold 3, heat-insulating cylinder 7, table 8, lid 9, and portions around these members Consequently, according to the film formation apparatus 100a, the silicon nitride film 60 is more uniformly formed on the surface of components inside the process container 1.

Where the film formation of the silicon nitride film 60 is performed after the cleaning process, the process container is prevented from suffering metal components scattered therein. Consequently, there is provided a metal contamination inhibiting method for a film formation apparatus, which can address a narrower allowable range of scattered metal quantity.

Where the process flow shown in FIG. 4 is combined with a semiconductor device manufacturing process, there is provided a semiconductor device manufacturing method that can manufacture semiconductor devices at high yield while preventing metal contamination.

Further, where the process flow shown in FIG. 4 is stored as a recipe to be executed by the controller 50, a film formation apparatus can perform the process at high yield while preventing metal contamination.

The thickness of the silicon nitride film 60 formed over the higher temperature area and lower temperature area is preferably set to be 18 nm to 300 nm. Where the film thickness is larger than 18 nm, the effect of sealing in metals is sufficiently obtained. Where the film thickness is smaller than 300 nm, the silicon nitride film 60 is prevented from being cracked and thereby from generating particles.

In the embodiment described above, the cleaning gas is exemplified by $CF_4$, $C_2F_6$, of $NF_3$, but the cleaning gas may be another halogen or halogen compound. Such another cleaning gas is exemplified by $F_2$, $ClF_3$, $COF_2$, or HCl.

In the embodiment described above, the film formation apparatus is designed to form an oxygen-containing thin film, such as a silicon oxide film, on target objects. Alternatively, the present invention may be applied to a film formation apparatus designed to form a nitrogen-containing thin film, such as a silicon nitride film, on target objects. Further, the present invention may be applied to a film formation apparatus designed to form an oxynitride film, such as a silicon oxynitride film, on target objects. In place of silicon treated as a material to be oxidized, nitrided, or oxynitrided, a metal material for semiconductor devices, such as hafnium or zirconium, may be treated for the same purpose.

In place of $O_3$ gas used as an oxygen-containing gas for performing oxidation, $O_2$ gas, $NO_2$ gas, NO gas, $N_2O$ gas, or $H_2O$ gas may be used for the same purpose. The process container 1 may be provided with a plasma generation mechanism to turn the oxygen-containing gas into plasma to enhance its reactivity. Where $O_3$ gas is used, the oxygen-containing gas supply source 17a may be provided with an ozonizer for generating $O_3$ gas.

The present invention is not limited to the embodiment described above, and it may be modified in various manners. For example, in the embodiment described above, the present invention is applied to a film formation apparatus of the batch type that performs a film formation process on a plurality of semiconductor wafers together at a time. Alternatively, the present invention may be applied to a film formation apparatus of the single-substrate type that performs a film formation process on wafers one by one. In the embodiment described above, a film formation source gas and an oxidizing agent (or nitriding agent, or oxynitriding agent) are alternately supplied, but they may be simultaneously supplied.

The target object is not limited to a semiconductor wafer, and the present invention may be applied to another substrate, such as an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus for a semiconductor process, which includes a vertical process container configured to set a vacuum state therein, a holder configured to hold a plurality of productive target objects stacked at intervals inside the process container, a heating device disposed around the process container, a gas supply system configured to supply process gases into the process container, and an exhaust system configured to exhaust gas from inside the process container, the method comprising:

repeating a film formation process a plurality of times respectively for a plurality of preceding batches of product target objects, the film formation process including alternately supplying a silicon source gas and a reactive gas containing oxygen or nitrogen into the process container accommodating the holder with each batch of productive target objects held thereon, and thereby forming a product film containing silicon and oxygen or nitrogen on the productive target objects;

performing an intermediate operation including a cleaning process and a coating process performed in this order inside the process container after the number of repetitions of the film formation process reaches a predetermined number, such that the cleaning process includes supplying a cleaning gas containing a halogen or halogen compound into the process container to remove by-products films deposited by the film formation process from an inner wall of the process container and a surface of the holder with no productive target objects held thereon, and the coating process includes alternately supplying the silicon source gas and a nitriding gas into the process container to form a coating film consisting of a silicon nitride film for inhibiting metal contamination, which covers the inner wall of the process container and the surface of the holder with no productive target objects held thereon; and repeating the film formation process a plurality of times respectively for a plurality of subsequent batches of product target objects, after the intermediate operation, wherein the process container has a higher temperature area corresponding to the holder and a lower temperature area below the holder, and the coating process is arranged such that the coating film has a film thickness tH at the higher temperature area and a film thickness tL at the lower temperature area with a ratio tH/tL of 1 to 15, while the film thicknesses tH and tL fall in a range of 18 nm to 300 nm.

2. The method according to claim 1, wherein the coating process comprises heating the higher temperature area by the heating device and heating the lower temperature area by an additional heater other than the heating device.

3. The method according to claim 1, wherein the coating process is arranged to use dichlorosilane as the silicon source gas and a process temperature of 550° C. to 650° C.

4. The method according to claim 1, wherein the coating process is arranged to use hexachlorodisilane as the silicon source gas and a process temperature of 450° C. to 550° C.

5. The method according to claim 1, wherein the cleaning gas is selected from the group consisting of $F_2$, $CF_4$, $C_2F_6$, $ClF_3$, $COF_2$, $NF_3$, and HCl.

6. The method according to claim 1, wherein the reactive gas used in the film formation process is an oxygen-containing gas, and the product film is a silicon oxide film.

7. The method according to claim 6, wherein the coating process uses a process temperature higher than that of the film formation process.

8. The method according to claim 1, wherein the nitriding gas used in the coating process is $NH_3$ gas.

9. The method according to claim 1, wherein the coating process further includes removing residual gas from inside the process container while supplying a purge gas into the process container, between supply of the silicon source gas and supply of the nitriding gas.

10. A film formation apparatus for a semiconductor process, the apparatus comprising:
a vertical process container configured to set a vacuum state therein;
a holder configured to hold a plurality of productive target objects stacked at intervals inside the process container;
a heating device disposed around the process container;
a gas supply system configured to supply process gases into the process container;
an exhaust system configured to exhaust gas from inside the process container; and
a control section configured to control an operation of the apparatus, wherein the control section includes a computer readable non-transitory storage medium containing program instructions for execution on a processor, the program instructions, when executed by the processor, controlling the film formation apparatus to conduct a sequence including
repeating a film formation process a plurality of times respectively for a plurality of preceding batches of product target objects, the film formation process including alternately supplying a silicon source gas and a reactive gas containing oxygen or nitrogen into the process container accommodating the holder with each batch of productive target objects held thereon, and thereby forming a product film containing silicon and oxygen or nitrogen on the productive target objects,
performing an intermediate operation including a cleaning process and a coating process performed in this order inside the process container after the number of repetitions of the film formation process reaches a predetermined number, such that
the cleaning process includes supplying a cleaning gas containing a halogen or halogen compound into the process container to remove by-product films deposited by the film formation process from an inner wall of the process container and a surface of the holder with no productive target objects held thereon, and
the coating process includes alternately supplying the silicon source gas and a nitriding gas into the process container to form a coating film consisting of a silicon nitride film for inhibiting metal contamination, which covers the inner wall of the process container and the surface of the holder with no productive target objects held thereon, and
repeating the film formation process a plurality of times respectively for a plurality of subsequent batches of product target objects, after the intermediate operation,
wherein the process container has a higher temperature area corresponding to the holder and a lower temperature area below the holder, and the coating process is arranged such that the coating film has a film thickness tH at the higher temperature area and a film thickness tL at the lower temperature area with a ratio tH/tL of 1 to 15, while the film thicknesses tH and tL fall in a range of 18 nm to 300 nm.

11. The apparatus according to claim 10, wherein the apparatus further comprises an additional heater other than the heating device, and the coating process comprises heating the higher temperature area by the heating device and heating the lower temperature area by the additional heater.

12. The apparatus according to claim 10, wherein the reactive gas used in the film formation process is an oxygen-containing gas, and the product film is a silicon oxide film.

13. The apparatus according to claim 12, wherein the coating process uses a process temperature higher than that of the film formation process.

14. A computer readable non-transitory storage medium containing program instructions for execution on a processor used for a film formation apparatus for a semiconductor process, which includes a vertical process container configured to set a vacuum state therein, a holder configured to hold a plurality of productive target objects stacked at intervals inside the process container, a heating device disposed around the process container, a gas supply system configured to supply process gases into the process container, and an exhaust system configured to exhaust gas from inside the process container,
wherein the program instructions, when executed by the processor, control the film formation apparatus to conduct a sequence including
repeating a film formation process a plurality of times respectively for a plurality of preceding batches of product target objects, the film formation process including alternately supplying a silicon source gas and a reactive gas containing oxygen or nitrogen into the process container accommodating the holder with each batch of productive target objects held thereon, and thereby forming a product film containing silicon and oxygen or nitrogen on the productive target objects,
performing an intermediate operation including a cleaning process and a coating process performed in this order inside the process container after the number of repetitions of the film formation process reaches a predetermined number, such that
the cleaning process includes supplying a cleaning gas containing a halogen or halogen compound into the process container to remove by-product films deposited by the film formation process from an inner wall of the process container and a surface of the holder with no productive target objects held thereon, and
the coating process includes alternately supplying the silicon source gas and a nitriding gas into the process container to form a coating film consisting of a silicon nitride film for inhibiting metal contamination, which covers the inner wall of the process container and the surface of the holder with no productive target objects held thereon, and repeating the film formation process a plurality of times respectively for a plurality of subsequent batches of product target objects, after the intermediate operation,
wherein the process container has a higher temperature area corresponding to the holder and a lower temperature area below the holder, and the coating process is arranged such that the coating film has a film thickness tH at the higher temperature area and a film thickness tL at the lower temperature area with a ratio tH/tL of 1 to 15, while the film thicknesses tH and tL fall in a range of 18 nm to 300 nm.

15. The storage medium according to claim 14, wherein the reactive gas used in the film formation process is an oxygen-containing gas, and the product film is a silicon oxide film.

16. The storage medium according to claim 15, wherein the coating process uses a process temperature higher than that of the film formation process.

* * * * *